United States Patent
Lee et al.

(10) Patent No.: US 12,293,901 B2
(45) Date of Patent: May 6, 2025

(54) SUBSTRATE PROCESSING APPARATUS INCLUDING SHOWER HEAD AND EDGE RING AND RELATED METHODS OF MANUFACTURING SEMICONDUCTOR DEVICES

(71) Applicant: Samsung Electronics Co., Ltd., Suwon-si (KR)

(72) Inventors: Woorim Lee, Hwaseong-si (KR); Sunggil Kang, Hwaseong-si (KR); Inseong Kim, Hwaseong-si (KR); Gonjun Kim, Suwon-si (KR); Younghoo Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 506 days.

(21) Appl. No.: 17/685,097

(22) Filed: Mar. 2, 2022

(65) Prior Publication Data
US 2022/0301827 A1    Sep. 22, 2022

(30) Foreign Application Priority Data
Mar. 16, 2021   (KR) ........................ 10-2021-0033719

(51) Int. Cl.
*H01L 21/02* (2006.01)
*H01J 37/32* (2006.01)
*H01L 21/683* (2006.01)

(52) U.S. Cl.
CPC .. *H01J 37/32449* (2013.01); *H01J 37/32495* (2013.01); *H01J 37/32642* (2013.01); *H01J 37/32715* (2013.01); *H01J 37/32743* (2013.01); *H01L 21/6833* (2013.01); *H01J 2237/2007* (2013.01); *H01J 2237/334* (2013.01)

(58) Field of Classification Search
CPC .................... H01L 21/02299; H01L 21/67069
See application file for complete search history.

(56) References Cited

U.S. PATENT DOCUMENTS

| | | |
|---|---|---|
| 6,464,794 B1 | 10/2002 | Park et al. |
| 6,815,352 B1 | 11/2004 | Tamura et al. |
| 8,192,577 B2 | 6/2012 | Satoh et al. |
| 10,280,121 B2 | 5/2019 | Okesaku et al. |

(Continued)

FOREIGN PATENT DOCUMENTS

| | | |
|---|---|---|
| KR | 10-0727672 B1 | 6/2007 |
| KR | 10-2018-0041073 A | 4/2018 |

*Primary Examiner* — Michele Fan
(74) *Attorney, Agent, or Firm* — Muir Patent Law, PLLC

(57) ABSTRACT

A manufacturing method includes depositing a chamber protective layer in a chamber, supplying a first purge gas to the chamber, transferring a substrate to the chamber, the substrate being disposed inside an edge ring on an electrostatic chuck, processing the substrate, supplying a second purge gas to the chamber, transferring the substrate to an outside of the chamber, removing the chamber protective layer, and supplying a third purge gas to the chamber. Variation of the surface roughness of the edge ring may be minimal. A ratio of an edge gas flow rate of gas supplied to an edge of the substrate and the edge ring to a central gas flow rate of gas supplied to a central portion of the substrate in the processing the substrate may be 0.05 to 19. The flow rate ratio may be more than 1 in the supplying the second purge gas.

16 Claims, 6 Drawing Sheets

(56) References Cited

U.S. PATENT DOCUMENTS

| | | |
|---|---|---|
| 10,941,303 B2 | 3/2021 | Larsson et al. |
| 2017/0207069 A1* | 7/2017 | Bhatia .................. C23C 16/452 |
| 2018/0135157 A1* | 5/2018 | Jeong ..................... C23C 4/123 |
| 2019/0338408 A1 | 11/2019 | He et al. |
| 2020/0051793 A1 | 2/2020 | Hwang et al. |

* cited by examiner

SUBSTRATE PROCESSING APPARATUS INCLUDING SHOWER HEAD AND EDGE RING AND RELATED METHODS OF MANUFACTURING SEMICONDUCTOR DEVICES

CROSS-REFERENCE TO THE RELATED APPLICATION

This application claims priority to Korean Patent Application No. 10-2021-0033719, filed on Mar. 16, 2021, in the Korean Intellectual Property Office, the disclosure of which is incorporated herein by reference in its entirety.

BACKGROUND

1. Field

The exemplary embodiments of the disclosure relate to a substrate processing apparatus including a shower head assembly and an edge ring, and methods of manufacturing semiconductor devices related to the same.

2. Description of the Related Art

In order to manufacture a highly-integrated and miniaturized semiconductor device, a substrate processing apparatus, which activates a process gas, thereby generating plasma, may be used. A substrate may be disposed on an electrostatic chuck and an edge ring in the substrate processing apparatus. Technology for preventing or reducing pollution (contamination) of the substrate in a substrate processing process is important.

SUMMARY

The exemplary embodiments of the disclosure provide a substrate processing apparatus and a manufacturing method capable of preventing/reducing pollution of a substrate.

A method of manufacturing a semiconductor device according to exemplary embodiments of the disclosure may include depositing a chamber protective layer in a chamber, supplying a first purge gas to an interior of the chamber, transferring a substrate to the interior of the chamber, the substrate being disposed on an electrostatic chuck and surrounded by an edge ring of the electrostatic chuck, processing the substrate, supplying a second purge gas to the interior of the chamber, transferring the substrate to an outside of the chamber, removing the chamber protective layer, and supplying a third purge gas to the interior of the chamber. The surface roughness of the edge ring may be 0.05 µm or less. A ratio of an edge gas flow rate of gas supplied to an edge of the substrate and the edge ring to a central gas flow rate of gas supplied to a central portion of the substrate when the processing the substrate may be in the range of 0.05 to 19. The ratio of the edge gas flow rate to the central gas flow rate may be more than 1 when the supplying the second purge gas.

A substrate processing apparatus according to exemplary embodiments of the disclosure may include a chamber configured to provide a processing space in an interior thereof; a support disposed in the interior of the chamber and configured to support a substrate laid thereon, the support including a base plate, an electrostatic chuck on the base plate, and an edge ring disposed on the electrostatic chuck to surround the substrate; a shower head assembly configured to supply gas to the processing space, the shower head assembly including a shower head, an insulating plate on the shower head, and an upper electrode on the insulating plate; and a flow rate adjuster configured to adjust a flow rate of gas supplied to the shower head assembly. The surface roughness Ra of the edge ring may be 0.05 µm or less. In processing the substrate, the flow rate adjuster may be configured to supply an edge gas to an edge of the substrate and the edge ring and to supply a central gas to a central portion of the substrate such that a ratio of the edge gas flow rate to the central gas flow rate of gas is in the range of 0.05 to 19. In purging the interior of the chamber, the flow rate adjuster may be configured to supply the edge gas and the central gas such that the ratio of the edge gas flow rate to the central gas flow rate is more than 1 in supply of a purge gas.

DETAILED DESCRIPTION OF EXEMPLARY EMBODIMENTS

Figure 1:
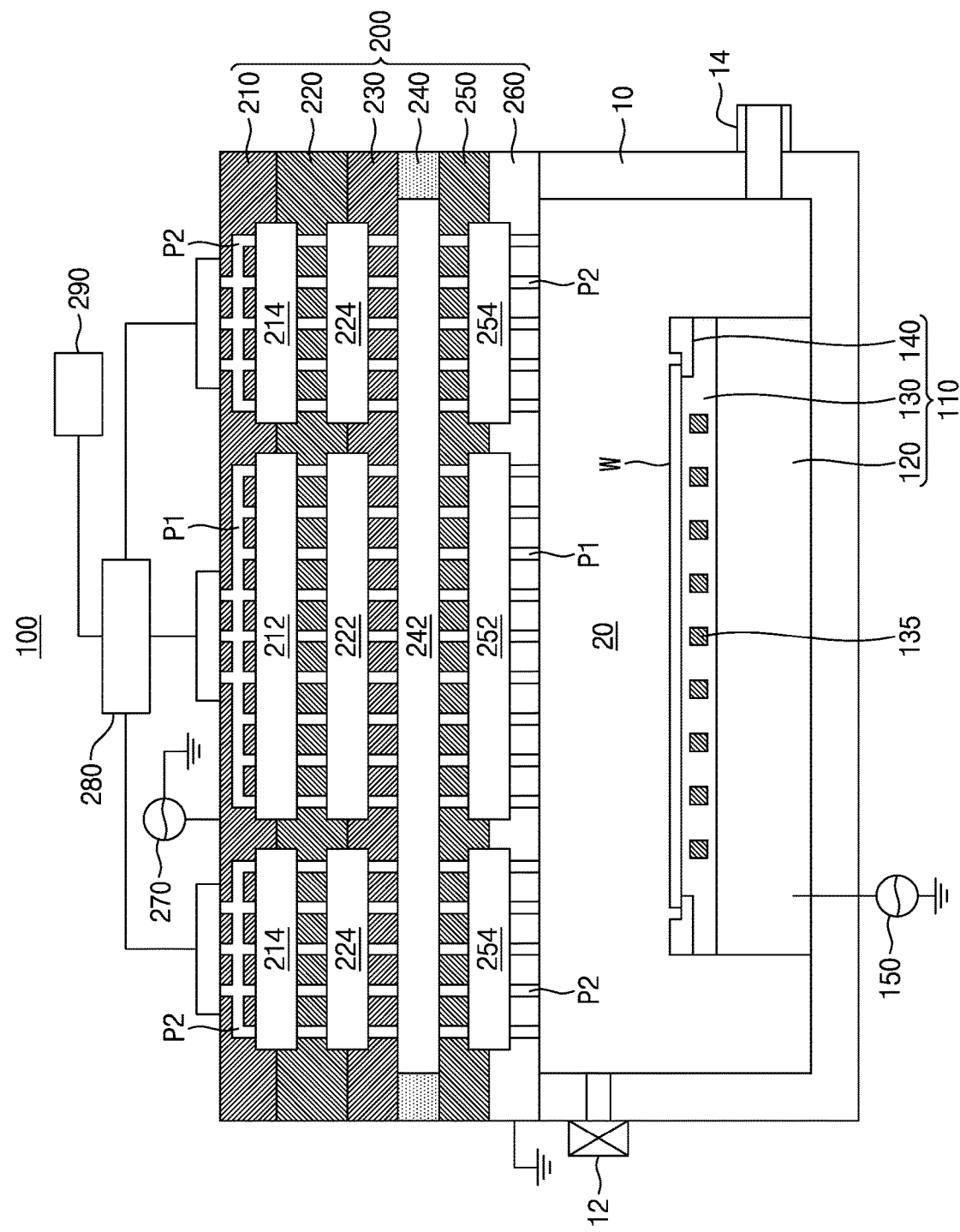
FIG. 1 is a sectional view of a substrate processing apparatus according to an exemplary embodiment of the disclosure.

FIG. 1 is a sectional view of a substrate processing apparatus according to an exemplary embodiment of the disclosure. As described herein, the substrate processing apparatus may be used to process a substrate to manufacture a semiconductor device. It will be appreciated that "substrate" as used herein may refer to an initial semiconductor substrate (such as a silicon-on-insulator (SOI) substrate, a bulk crystalline silicon substrate, etc.) and may also refer to wafer comprising an initial semiconductor substrate with additional layers formed thereon (e.g., a wafer comprising an intermediate structure being processed to form a semiconductor devices having integrated circuits formed therein, which when separated from the wafer form corresponding semiconductor chips).

Referring to FIG. 1, a substrate processing apparatus 100 may include a chamber 10, a support 110 disposed in an interior of the chamber 10, and a shower head assembly 200 at an upper portion of the chamber 10.

The chamber 10 may include a gate 12 and a gas outlet 14 which are disposed at an outer wall of the chamber 10. The chamber 10 may have a flat bottom disposed at a lower portion of the chamber 10, and side walls extending from the flat bottom in a vertical direction. The flat bottom and the side walls may define a processing space 20 of the interior of the chamber 10. The gate 12 may be disposed at the side wall of the chamber 10, and a substrate W may be transferred, by a transfer device, to the interior of the chamber 10 or to the outside of the chamber 10 using the gate 12 as an entryway into the chamber 10 or exit from the chamber 10. The gas outlet 14 may be disposed at the side wall of the chamber 10, and may be connected to a pump (not shown) configured to provide a vacuum pressure to suck gas from the chamber 10. In an embodiment, the gas outlet 14 may be disposed at the lower portion of the chamber 10. The chamber 10 may further include a pump (not shown) configured to evacuate the processing space 20 in the chamber 10.

The support 110 may be disposed at the lower portion of the chamber 10, and may face the shower head assembly 200. The support 110 may include a base plate 120, an electrostatic chuck 130, and an edge ring 140. The base plate 120 may be formed of a metal such as aluminum (Al), nickel (Ni), titanium (Ti), stainless steel, tungsten (W), or an alloy thereof. The base plate 120 may have, for example, a cylindrical shape. The substrate processing apparatus 100 may further include a lower power source 150 connected to the base plate 120. The lower power source 150 may supply radio frequency (RF) power to the base plate 120, and the base plate 120 may function as a lower electrode for generation of plasma. The lower power source 150 may supply a voltage having a frequency of for example, 13.56 MHz, 27 MHz, or 40 MHz, to the base plate 120. Although not shown, the base plate 120 may further include a cooling device for wafer cooling and a temperature sensor therein.

The electrostatic chuck 130 may be disposed on the base plate 120. A topmost surface of the electrostatic chuck 130 may be narrower than a bottom surface of the electrostatic chuck 130. For example, the width of the bottom surface of the electrostatic chuck 130 may be equal to the width of the top surface of the base plate 120, and the width of the topmost surface of the electrostatic chuck 130 may be smaller than the width of the bottom surface of the electrostatic chuck 130. The electrostatic chuck 130 may include an attraction electrode 135 therein. The electrostatic chuck 130 may be formed of a dielectric material such as a ceramic and/or a resin. The ceramic may be at least one of aluminum oxide ($Al_2O_3$), aluminum nitride (AlN), or yttrium oxide ($Y_2O_3$). The resin may be polyimide, etc.

The attraction electrode 135 may be connected to a DC power source (not shown), and may attract the wafer W through electrostatic force by a DC voltage supplied from the DC power source, thereby maintaining the wafer W in a state of being attached to the electrostatic chuck 130.

The attraction electrode 135 may be formed of a metal such as tungsten (W), copper (Cu), nickel (Ni), molybdenum (Mo), titanium (Ti), a nickel-chrome alloy (Ni—Cr alloy), a nickel-aluminum alloy (Ni—Al alloy), etc., or a conductive ceramic such as tungsten carbide (WC), molybdenum carbide (MoC), titanium nitride (TiN), etc.

The edge ring 140 may be disposed on the electrostatic chuck 130, and may be disposed at a side surface of the substrate W. For example, the edge ring 140 may surround the substrate W, and may have a ring shape or a donut shape. The edge ring 140 may have a stepped structure in which a lower portion thereof is greater than an upper portion thereof. For example, the lower portion may extend further in the horizontal direction than the upper portion, and an outer side surface of the lower portion of the edge ring 140 is coplanar with an outer side surface of the upper portion of the edge ring 140, and an inner side surface of the lower portion may be closer to the center of the electrostatic chuck 130 than an inner side surface of the upper portion. The upper surface of the lower portion of the edge ring 140 may be flush (e.g., the same level) with the topmost surface of the electrostatic chuck 130. The edge ring 140 may be provided to enhance plasma uniformity in substrate processing. The edge ring 140 may include quartz, sapphire, glass, ceramic, metal, or a combination thereof.

Figure 2:
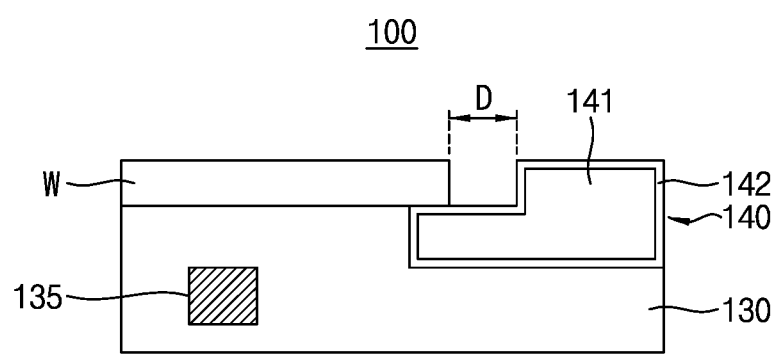
FIG. 2 is an enlarged view of a portion of the substrate processing apparatus shown in FIG. 1.

FIG. 2 is an enlarged view of a portion of the substrate processing apparatus shown in FIG. 1.

The edge ring 140 according to the exemplary embodiment of the disclosure may be designed to prevent pollutants generated from the substrate W and the electrostatic chuck 130 from being attached to a surface thereof. Referring to FIG. 2, a horizontal distance D between the substrate W and a side surface of the edge ring 140 may be sufficiently small to prevent or significantly reduce plasma from penetrating to the side surface of the substrate W and contacting the same. Here, the horizontal distance D between the substrate W and the edge ring 140 may mean the horizontal distance between the side surface of the substrate W and an inner side surface of the edge ring 140 facing the side surface of the substrate W. When the horizontal distance D between the substrate W and the edge ring 140 is smaller than a sheath thickness, penetration of plasma into the space between the substrate W and the edge ring 140 may be difficult. For example, a gap may be formed between the side surface of the substrate W and an inner side surface of the edge ring 140, and the horizontal distance D between the substrate W and the side surface of the edge ring 140 across the gap may be more than 0, but equal to or less than 2 mm. Although the gap may form part of processing space 20 of the interior of the chamber 10, the small width of the gap may prevent or significantly reduce plasma from penetrating into the gap and contacting the side surface of the substrate W. The edge ring 140 may have a surface roughness and a porosity sufficiently small to prevent pollutants from being attached to the surface of the edge ring 140. When the surface roughness and the porosity of the edge ring 140 are small, it may be possible to prevent pollutants attached to the surface of the edge ring 140 from contaminating the substrate W. For example, a surface roughness Ra of the edge ring 140 may be more than 0, but equal to or less than 0.05 µm, the porosity of the edge ring 140 may be 1% or less. In addition, the surface roughness of the edge ring 140 may be hardly altered by a repeated processes of the chamber 10. For example, after repeating a process for 100 hours or more (e.g., corresponding to that of FIG. 4), variation of the surface roughness Ra of the edge ring 140 may be more than 0, but equal to or less than $10^{-3}$ µm. The edge ring 140 may include a material for minimizing variation of surface roughness, and may include, for example, an edge ring protective layer 142 at the surface thereof. The edge ring protective layer 142 may be formed of at least one of yttrium oxide ($Y_xO_y$, for example, $Y_2O_3$) or yttrium oxyfluoride ($Y_xO_yF_z$, for example, YOF). The edge ring protective layer 142 may be layer formed on a bulk portion 141 of the edge ring 140. The bulk portion 141 may be formed of quartz, sapphire, glass, ceramic, metal, or a combination thereof.

Figure 3:
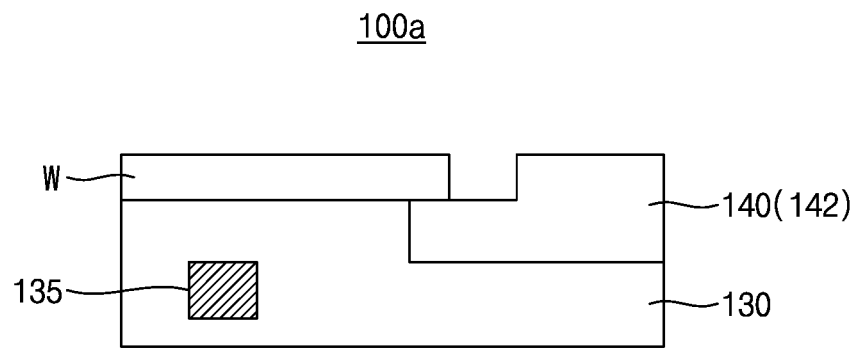
FIG. 3 is an enlarged view of a portion of a substrate processing apparatus according to an embodiment.

FIG. 3 is an enlarged view of a portion of a substrate processing apparatus according to an embodiment.

Referring to FIG. 3, a substrate processing apparatus 100a may include an edge ring 140 that is constituted by a bulk type edge ring protective layer 142. For example, the edge ring 140 may be formed of yttrium oxide ($Y_xO_y$, for example, $Y_2O_3$) or yttrium oxyfluoride ($Y_xO_yF_z$, for example, YOF).

Again referring to FIG. 1, the shower head assembly 200 may be disposed at the upper portion of the chamber 10. For example, the shower head assembly 200 may be disposed on the side wall of the chamber 10, and may form the top surface of the chamber 10. The shower head assembly 200 may have a cylindrical shape, and may supply gas to the interior of the chamber 10. For example, the shower head assembly 200 may include, therein, central passages P1 and edge passages P2 vertically extending through the shower head assembly 200. With respect to a plan view, the central passages P1 may be regularly distributed within a circle (or disk), while the edge passages P2 may be regularly distributed within a ring that surrounds such a circle in a concentric manner. The central passages P1 may be disposed at a central portion of the shower head assembly 200, and may face the substrate W directly above the center of the substrate W. The edge passages P2 may be disposed at an edge of the shower head assembly 200, and may face the edge of the substrate W and the edge ring 140 (e.g., directly above the edge of the substrate W and the edge ring 140).

The shower head assembly 200 may include an upper electrode 210, an upper plate 220, a middle plate 230, an insulating plate 240, a lower plate 250, and a shower head 260. Each of the upper electrode 210, the upper plate 220, the middle plate 230, the lower plate 250 and the shower head 260 may have a disc shape, and the insulating plate 240 may have a ring shape or a donut shape. The upper electrode 210, the upper plate 220, the middle plate 230, the lower plate 250 and the shower head 260 may include a metal such as aluminum (Al), titanium (Ti), stainless steel, tungsten (W), or an alloy thereof. The insulating plate 240 may be formed of an insulating material, and may be formed of, for example, a ceramic such as aluminum oxide ($Al_2O_3$), aluminum nitride (AlN), or yttrium oxide ($Y_2O_3$).

The upper electrode 210 may be disposed at an uppermost portion of the shower head assembly 200. The substrate processing apparatus 100 may further include an upper power source 270 connected to the upper electrode 210. The upper power source 270 may supply RF power to the upper electrode 210, for the generation of plasma. The upper power source 270 may supply a voltage having a frequency of for example, 13.56 MHz, 27 MHz, or 40 MHz, to the upper electrode 210.

The upper plate 220 may contact a bottom surface of the upper electrode 210. The upper electrode 210 and the upper plate 220 may define plenums. For example, the upper electrode 210 may include recesses at a central portion and at an edge of the bottom surface thereof, and the upper plate 220 may include recesses at a central portion and at an edge of a top surface thereof. The recesses of the upper electrode 210 and the recesses of the upper plate 220 may be disposed to correspond to each other, and the recesses may define a first upper central plenum 212 and a first upper edge plenum 214. The first upper central plenum 212 may be disposed at the central portions of the upper electrode 210 and the upper plate 220, and the first upper edge plenum 214 may be disposed at the edges of the upper electrode 210 and the upper plate 220.

The middle plate 230 may contact a bottom surface of the upper plate 220. The upper plate 220 may include recesses at a central portion and an edge of the bottom surface thereof, and the middle plate 230 may include recesses at a central portion and an edge of a top surface thereof. The recesses of the upper plate 220 and the recesses of the middle plate 230 may define a second upper central plenum 222 and a second upper edge plenum 224. The second upper central plenum 222 may communicate with the first upper central plenum 212 by the central passages P1, and may vertically overlap with the first upper central plenum 212. The second upper edge plenum 224 may communicate with the first upper edge plenum 214 by the edge passages P2, and may vertically overlap with the first upper edge plenum 214.

The insulating plate 240 may be disposed between the middle plate 230 and the lower plate 250, and may electrically insulate the middle plate 230 and the lower plate 250 from each other. The insulating plate 240 may have a ring shape or a donut shape, as described above, and may define a cavity 242 at an inside thereof. The cavity 242 may communicate with the plenums 212, 214, 222 and 224 by the central passages P1 and the edge passages P2. The cavity 242 may be provided as a space for forming plasma in an interior of the shower head assembly 200. For example, RF power supplied to the upper electrode 210 by the upper power source 270 may form plasma in the cavity 242. The pressure of the cavity 242 may be higher than the pressure of the processing space 20 and, as such, plasma with radicals being predominant may be formed. For example, the plasma is radical-rich plasma, and may contain more radicals than electrons/ions.

Each of cavity 242 and the central plenums 212, and 222 may be a cavity having a cylindrical shape. Edge plenums 214, 224 may each be a cavity having a ring or donut shape. Each of the plenums 212, 214, 222 and 224 may be a space configured to supply gas to the cavity 242, and may be provided to easily adjust a flow rate of gas supplied to the cavity 242. Although two upper central plenums 212 and 222 and two upper edge plenums 214 and 224 are shown in FIG. 1, the exemplary embodiments of the disclosure are not limited thereto. In an embodiment, one upper central plenum and one upper edge plenum may be formed between the upper electrode 210 and the insulating plate 240. Alternatively, three or more upper central plenums and three or more upper edge plenums may be formed between the upper electrode 210 and the insulating plate 240. Furthermore, rather than a single continuous upper edge plenum (e.g., a ring or donut shaped plenum), an upper edge plenum may be formed as several discrete spaces that are disposed at the same level and spatially separated from each other. Upper edge plenums 214 and 224 may be spatially separated from the upper central plenums 212 and 222.

The shower head 260 and the chamber 10 may be grounded. The shower head 260 may contact a bottom surface of the lower plate 250. The lower plate 250 may include recesses at a central portion and an edge of the bottom surface thereof, and the shower head 260 may include recesses at a central portion and an edge of a top surface thereof. The recesses of the lower plate 250 and the recesses of the shower head 260 may define a lower central plenum 252 and a lower edge plenum 254. The lower central plenum 252 may communicate with the cavity 242 and the processing space 20 by the central passages P1, and the lower edge plenum 254 may communicate with the cavity 242 and the processing space 20 by the edge passages P2. Each of lower central plenum 252 and the lower edge plenum 254 may be a space configured to supply gas to the processing space 20, and may be provided to easily adjust a flow rate of gas supplied to the processing space 20. For example, RF power supplied to the base plate 120 by the lower power source 150 may form plasma in the processing space 20. In the processing space 20, plasma with ions and electrons being predominant may be formed. For example, the plasma is electron/ion-rich plasma, and may contain more electrons/ions than radicals. The lower edge plenum 254 may be a single continuous space or may be formed of several discretely formed spaces that are spatially separated from each other. The lower central plenum 252 and the lower edge plenum 254 may be spatially separated from each other.

In an embodiment, a difference between fluid conductance of the central portion and fluid conductance of the edge in the shower head assembly 200 may be within 3%. For example, a difference between the sum of fluid conductance values of the central plenums 212, 222 and 252 and the sum of fluid conductance values of the edge plenums 214, 224 and 254 may be within 3%. Otherwise, a difference between fluid conductance of each of the central plenums 212, 222 and 252 and fluid conductance of a corresponding one of the edge plenums 214, 224 and 254 may be within 3%. As will be appreciated, if flow rate Q refers to a volume of fluid (e.g., gas) which passes per unit time through a path, and $P_1$ and $P_2$ respectively represent upstream and downstream pressures of the path, fluid conductance $C=Q/(P_1-P_2)$.

The substrate processing apparatus 100 may further include a flow rate adjuster 280 and a gas supplier 290. The flow rate adjuster 280 may adjust a flow rate of gas supplied to the shower head assembly 200, and may independently supply gas to each of the central portion and the edge of the shower head assembly 200. For example, flow rates of gas respectively supplied to the central passages P1 and the edge passages P2 by the flow rate adjuster 280 may be different from each other. In an embodiment, the ratio of the flow rate of gas supplied to the edge passages P2 to the flow rate of gas supplied to the central passages P1 may be adjusted by adjuster 280 to be anywhere within the range of 0.05 to 19. The gas supplier 290 may supply gas for deposition, substrate processing and purging.

Figure 4:
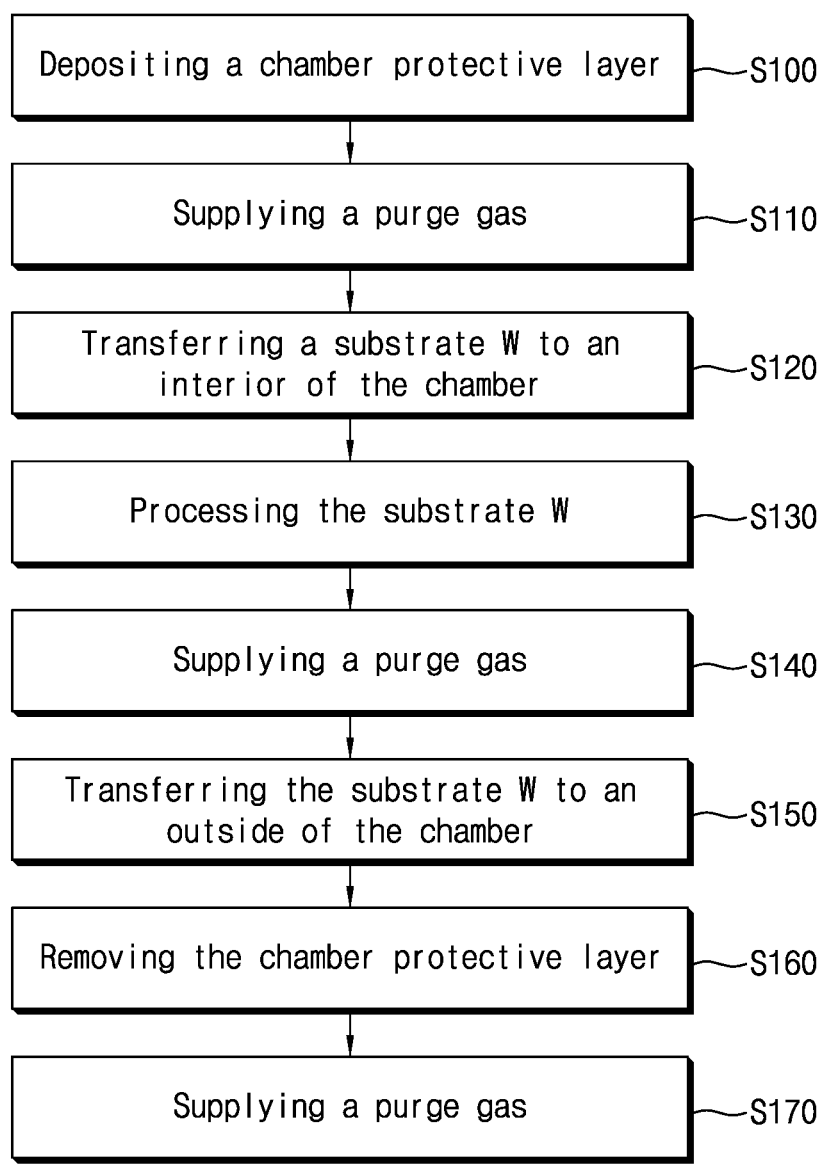
FIG. 4 is a flowchart of a substrate processing method according to an exemplary embodiment of the disclosure.
Figure 5:
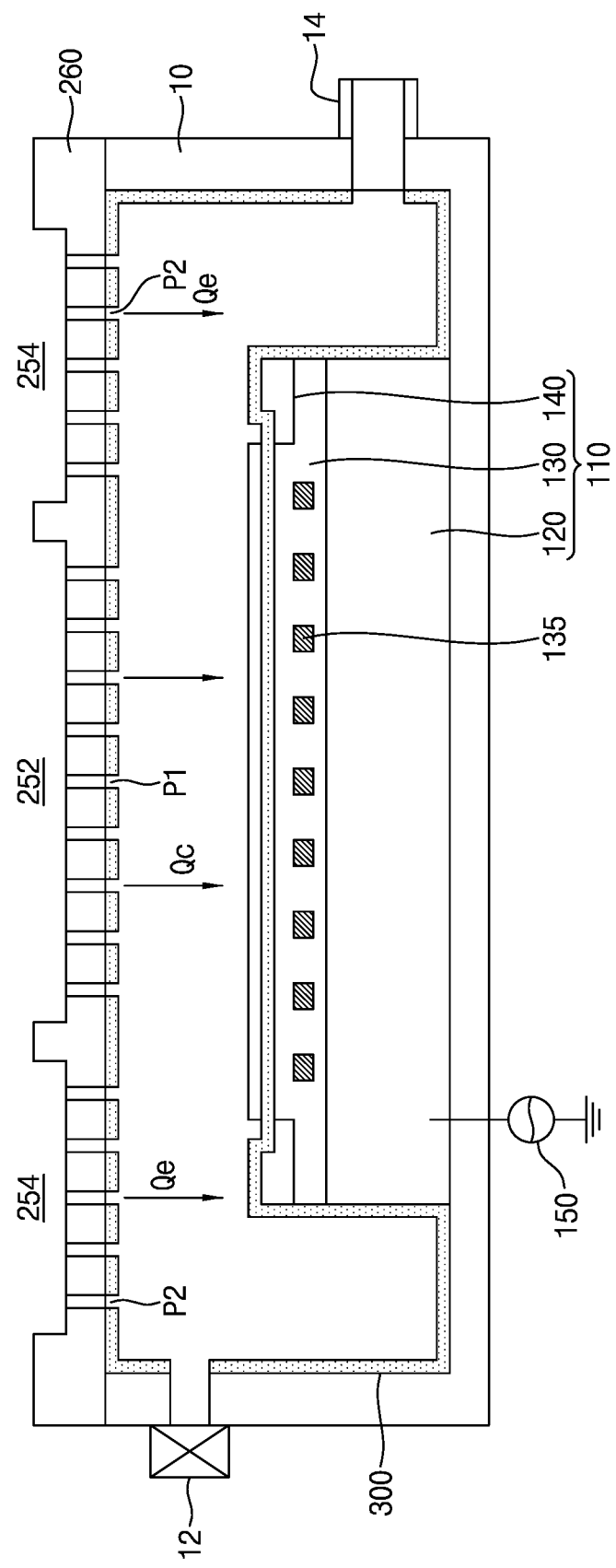
FIGS. 5 to 7 are enlarged views of a portion of a substrate processing apparatus shown in accordance with a process sequence in order to explain the substrate processing method.
Figure 6:
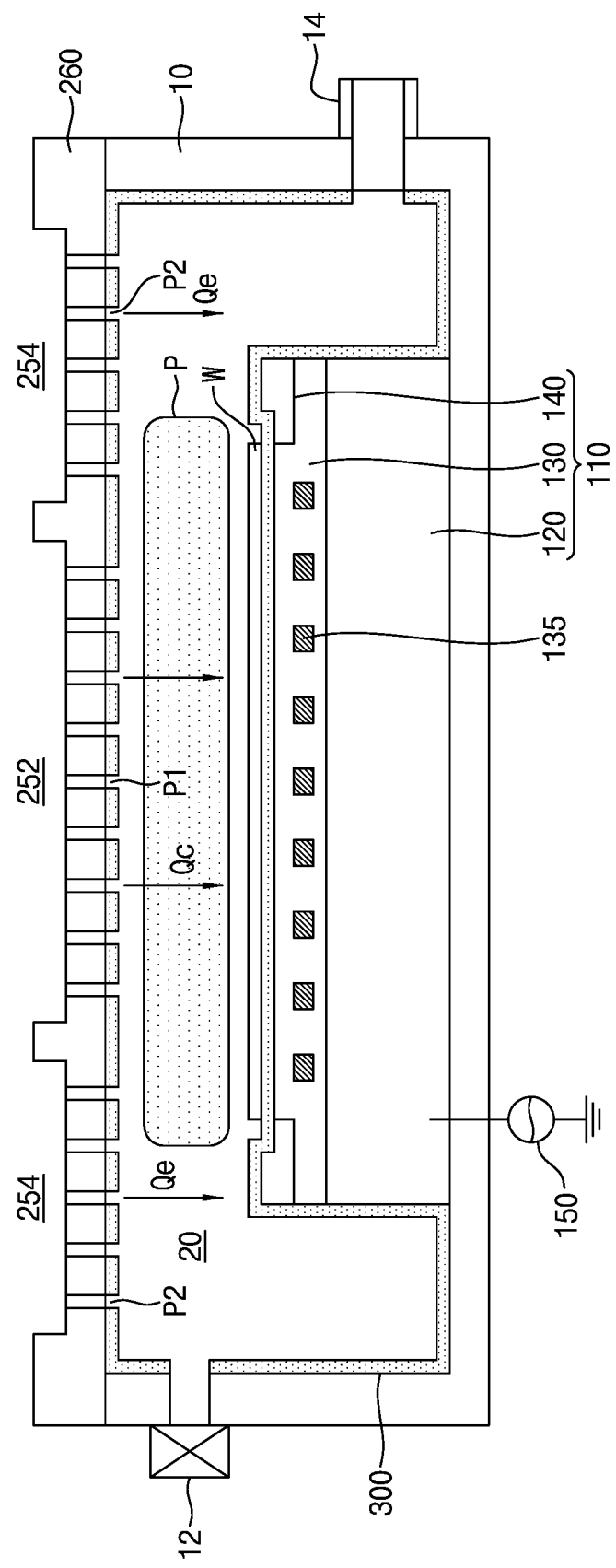
Figure 7:
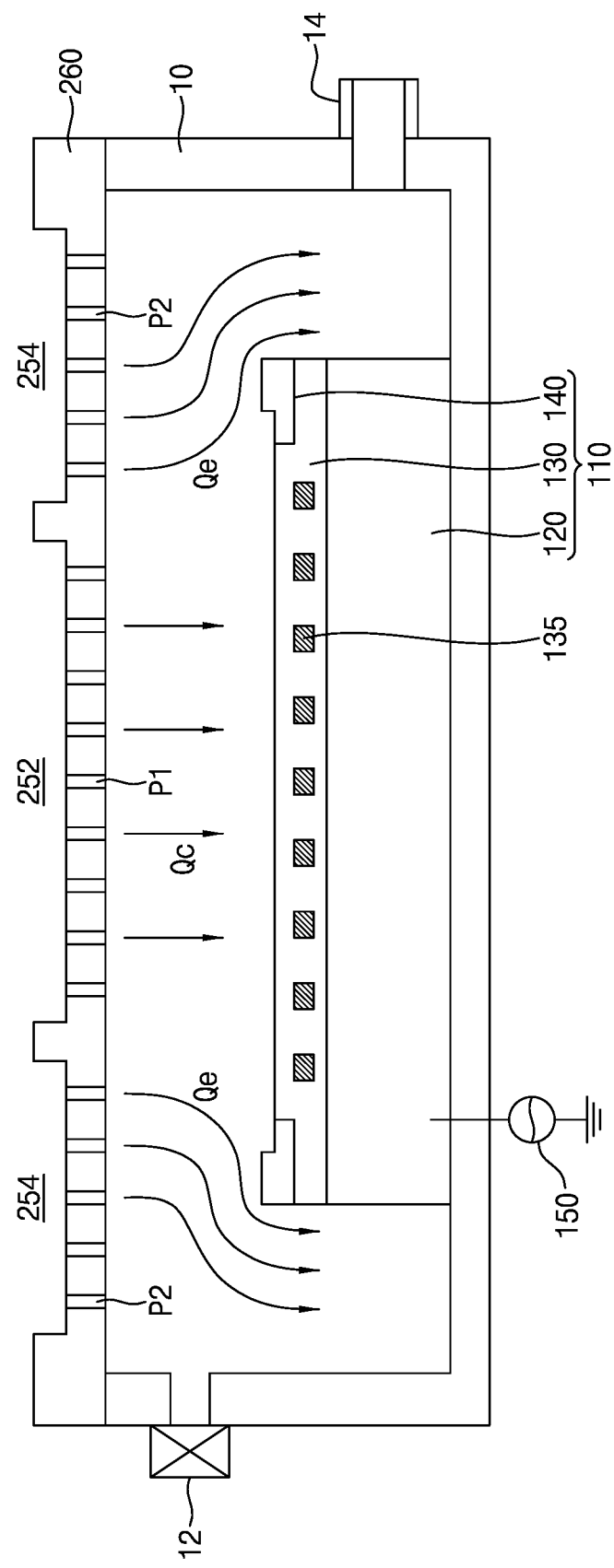

FIG. 4 is a flowchart of a substrate processing method according to an exemplary embodiment of the disclosure. FIGS. 5 to 7 are enlarged views of a portion of a substrate processing apparatus shown in accordance with a process sequence in order to explain the substrate processing method. In an embodiment, the substrate processing method may include a chamber seasoning process and a dry cleaning process.

Referring to FIG. 4, the substrate processing method may include depositing a chamber protective layer 300 (S100), supplying a purge gas (S110), transferring a substrate W to an interior of a chamber 10 (S120), processing the substrate W (S130), supplying a purge gas (S140), transferring the substrate W to an outside of the chamber 10 (S150), removing the chamber protective layer 300 (S160), and supplying a purge gas (S170). Procedures S100 to S170 may be repeatedly performed, such as with respect to processing of different substrates W.

Referring to FIG. 5, deposition of the chamber protective layer 300 (S100) may be performed. Deposition of the chamber protective layer 300 (S100) may include forming plasma in the chamber 10, and supplying a deposition gas. In an embodiment, the lower power source 150 may be used in order to form plasma from the deposition precursor gas, and plasma may be formed in a processing space 20. The deposition process may include a chemical vapor deposition (CVD) process and an atomic layer deposition (ALD) process. In an embodiment, the deposition process may be a plasma-enhanced CVD (PECVD) process. A plasma formation gas may be supplied to the interior of the chamber 10, and the plasma formation gas may include $NF_3$. For plasma uniformity in plasma formation, flow rates of plasma formation gas supplied from central passages P1 and edge passages P2 may be suitably adjusted. For example, a ratio Qe/Qc of an edge gas flow rate Qe to a central gas flow rate Qc may be 0.05 to 19. Here, the central gas flow rate Qc refers to the flow rate of gas supplied from the central passages P1 (which is provided to a central portion of the substrate W), and the edge gas flow rate Qe refers to the flow rate of gas supplied from the edge passages P2 (which is provided to an edge of the substrate W and an edge ring 140).

After formation of plasma from the plasma formation gas (e.g., $NF_3$), a deposition gas for formation of the chamber protective layer 300 may be supplied. The deposition gas may be $SiH_4$, $N_2O$, and/or $NH_3$. In addition, a carrier gas such as He, Ar and $N_2$ may be supplied together with the deposition gas. Deposition of the chamber protective layer 300 (S100) may be performed by supplying RF power of 100 to 500 W to the base plate 120 under a pressure of 100 to 1,000 mT. The chamber protective layer 300 may be a layer of silicon oxide, silicon nitride, silicon oxynitride, or a combination thereof.

The chamber protective layer 300 may be uniformly formed (e.g., conformally formed) in the processing space 20. For example, the chamber protective layer 300 may be a conformal layer formed along (and contact) an inner wall of the chamber 10, a bottom surface of a shower head 260, and a side surface and a top surface of a support 110, including along the topmost surface of electrostatic chuck 130 and along top and side surfaces of edge ring 140. The thickness of the chamber protective layer 300 may be 500 Å or more. The chamber protective layer 300 may not be deposited at regions respectively corresponding to a gate 12, a gas outlet 14, central passages P1 and edge passages P2.

Supply of a purge gas to the interior of the chamber 10 (S110) may be performed before the substrate W is transferred to the interior of the chamber 10 after deposition of the chamber protective layer 300. The purge gas may discharge a byproduct of the deposition process, the deposition gas, etc. to the outside of the chamber 10 through the gas outlet 14. The flow rate of the purge gas discharged from the central passages P1 and the edge passages P2 may be suitably adjusted in order to exhaust gas from the chamber 10. In some embodiments, the ratio Qe/Qc of the edge gas flow rate Qe to the central gas flow rate Qc of the purge gas may be more than 1.

After the interior of the chamber 10 is purged, the substrate W may be transferred to the interior of the chamber 10 (S120). The substrate W may be transferred to the interior of the chamber 10 through the gate 12 by a transfer device. The transferred substrate W may be disposed on the electrostatic chuck 130, and may be disposed inside the edge ring 140.

Referring to FIG. 6, a substrate processing process (S130) may be performed. The substrate processing process may include forming plasma P, and depositing an insulating material, a conductive material, etc. on the substrate W or performing an etching process. The plasma P for substrate processing may be formed in the processing space 20 and cavity 242. For example, the plasma P may first be formed in the processing space 20. The plasma P may be plasma with electrons and ions being predominant, and may be used for surface processing of the substrate W. After surface processing, plasma P may be formed in the cavity 242 and may then be transferred to the processing spacer 20. As described above with reference to FIG. 1, a plasma formation gas may be transferred from plenums 212, 214, 222 and 224 to the cavity 242, and plasma P formed in the cavity 242 may be transferred to the processing space 20 along gas passages P1 and P2 through lower plenums 252 and 254. For formation of the plasma P in the cavity 242, an upper power source 270 may be used. The plasma P formed in the cavity 242 may be plasma with radicals being predominant, and may be used for substrate processing such as deposition of a layer on the substrate W, etching of the substrate W, etc.

After performing the substrate processing process, supply of a purge gas to the interior of the chamber 10 (S140) may be performed. Supply of the purge gas (S140) may be performed through a method identical or similar to the method described with reference to the procedure S110.

Thereafter, the substrate W may be transferred to the outside of the chamber 10 (S150). The substrate W may be transferred to the outside of the chamber 10 through the gate 12 by the transfer device.

Referring to FIG. 7, removal of the chamber protective layer 300 (S160) may be performed after transfer of the substrate W to the outside of the chamber 10.

Removal of the chamber protective layer 300 (S160) may be achieved by forming plasma in the chamber 10, and performing dry cleaning using the plasma. In an embodiment, for formation of the plasma, the lower power source 150 may be used, and the plasma may be formed in the processing space 20. For formation of the plasma, a plasma formation gas may be supplied to the interior of the chamber 10, and the plasma formation gas may include $NF_3$. Removal of the chamber protective layer 300 (S160) may be performed by supplying RF power of 100 to 500 W to the base plate 120 under a pressure of 500 to 2,000 mT. The ratio of gas flow rates Qc and Qe may refer to the ratio described with reference to the procedure S110.

After removing the chamber protective layer 300, supply of a purge gas to the interior of the chamber 10 (S170) may be performed. The ratio of gas flow rates Qc and Qe supplied to the processing space 20 in the procedures S170 and S140 may refer to the ratio described with reference to the procedure S110.

After execution of supply of the purge gas (S170), the procedures S100 to S170 may be repeatedly performed (e.g., with respect to different substrates W) and, as such, the substrate processing process (e.g., of FIG. 4) may be repeated. In some instances, the substrate processing process described herein may be performed on the same substrate W (e.g., two different deposition processes) and/or the processing of a substrate W may be subject to a substrate processing process as described herein multiple times that are performed by different substrate processing apparatuses (e.g., for different processing steps of depositing and/or etching of different layers of the substrate W). After the substrate W is finished, additional semiconductor manufacturing steps may be performed, such as cutting (singulating) semiconductor devices from the substrate W to form corresponding semiconductor chips and packaging one or more of the semiconductor chips in semiconductor packages.

In the procedure S160 of removing the chamber protective layer 300, particles such as aluminum fluoride ($Al_xF_y$), aluminum oxyfluoride ($Al_xO_yF_z$), nickel fluoride ($Ni_xF_y$), yttrium oxyfluoride ($Y_xO_yF_z$), etc. and metal ions such as aluminum (Al), yttrium (Y), etc. may be generated from the base plate 120 and the electrostatic chuck 130 when exposed to plasma. The particles and metal ions are non-volatile materials and, as such, may not be discharged to the outside of the chamber 10 during the purge gas supply procedure S170. However, since the edge ring 140 according to the exemplary embodiment of the disclosure has physical characteristics of small surface roughness and small porosity, it may be possible to prevent pollutants such as particles and metal ions from being attached to the edge ring 140. Accordingly, it may be possible to prevent the substrate W from being contaminated by pollutants attached to the edge ring 140.

In accordance with the exemplary embodiments of the disclosure, the edge ring of the substrate processing apparatus may have physical characteristics causing pollutants to have difficulty to attach to the edge ring, and the shower head assembly may adjust a gas flow rate in order to exhaust pollutants and, as such, pollution of the edge ring is reduced or avoided and thus pollution (from residual contaminants that may have otherwise been attached to the edge ring) of subsequently processed substrates is also reduced or avoided.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method of manufacturing a semiconductor device comprising:
   depositing a chamber protective layer in a chamber;
   supplying a first purge gas to an interior of the chamber;
   transferring a substrate to the interior of the chamber, the substrate being disposed on an electrostatic chuck and surrounded by an edge ring of the electrostatic chuck;
   processing the substrate;
   supplying a second purge gas to the interior of the chamber;
   transferring the substrate to outside of the chamber;
   wherein the surface roughness Ra of the edge ring is 0.05 µm or less,
   wherein a ratio of an edge gas flow rate of gas supplied to an edge of the substrate and the edge ring to a central gas flow rate of gas supplied to a central portion of the substrate when the processing the substrate is in the range of 0.05 to 19,
   wherein the ratio of the edge gas flow rate to the central gas flow rate is more than 1 when supplying the second purge gas.

2. The manufacturing method according to claim 1,
   wherein the chamber includes a shower head assembly configured to supply gas to the interior of the chamber, and a processing space is defined by an inner wall of the chamber and the shower head assembly, and
   wherein the shower head assembly includes therein central passages and edge passages through the shower head assembly, the central passages being disposed between the edge passages.

3. The manufacturing method according to claim 2,
   wherein the depositing the chamber protective layer includes:
   forming a plasma in the processing space; and
   supplying a plasma formation gas to the processing space through the central passages and the edge passages, and
   wherein a ratio of the edge gas flow rate supplied from the edge passages to the central gas flow rate supplied from the central passages is in the range of 0.05 to 19.

4. The manufacturing method according to claim 2,
   wherein the first purge gas is supplied to the processing space through the central passages and the edge passages, and
   wherein a ratio of the edge gas flow rate supplied from the edge passages to the central gas flow rate supplied from the central passages is more than 1.

5. The manufacturing method according to claim 2,
   wherein the processing the substrate includes:
   forming a first plasma in the processing space; and
   forming a second plasma in a cavity within the shower head assembly.

6. The manufacturing method according to claim 5,
   wherein the first plasma is electron/ion-rich plasma and the second plasma is radical-rich plasma.

7. The manufacturing method according to claim 2, wherein the chamber protective layer is conformally formed along the inner wall of the chamber and a lower surface of the shower head assembly.

8. The manufacturing method according to claim 2, wherein a difference between a fluid conductance of the central portion and a fluid conductance of the edge in the shower head assembly is within 3%.

9. The manufacturing method according to claim 1, wherein the chamber protective layer includes at least one of silicon oxide, silicon nitride, or silicon oxynitride.

10. The manufacturing method according to claim 1, wherein the porosity of the edge ring is 1% or less.

11. The manufacturing method according to claim 1, wherein a gap is formed between a side surface of the substrate and a side surface of the edge ring, and a horizontal distance between the edge ring and the substrate across the gap is 2 mm or less.

12. The manufacturing method according to claim 1, wherein:
the edge ring includes an edge ring protective layer at a surface thereof; and
the edge ring protective layer includes at least one of yttrium oxide or yttrium oxyfluoride.

13. The manufacturing method according to claim 1, wherein the edge ring is made of a material including at least one of yttrium oxide or yttrium oxyfluoride.

14. The manufacturing method according to claim 1, wherein the electrostatic chuck includes at least one of aluminum oxide, aluminum nitride, or yttrium oxide.

15. The method of claim 1, further comprising:
after transferring the substrate to outside the chamber, removing the chamber protective layer; and
supplying a third purge gas to the interior of the chamber.

16. The method of claim 1, wherein processing the substrate comprises performing plasma-enhanced chemical deposition process, wherein the edge ring is configured such that the surface roughness Ra of the edge ring is modified less than $10^{-3}$ upon performing a series of plasma-enhanced chemical deposition processes for at least 100 hours within the chamber.

* * * * *